United States Patent
Walker

(10) Patent No.: US 9,431,088 B1
(45) Date of Patent: Aug. 30, 2016

(54) PACKAGE INCLUDING A PLURALITY OF STACKED SEMICONDUCTOR DEVICES INCLUDING A CAPACITANCE ENHANCED THROUGH VIA AND METHOD OF MANUFACTURE

(71) Applicant: Darryl G. Walker, San Jose, CA (US)

(72) Inventor: Darryl G. Walker, San Jose, CA (US)

(*) Notice: Subject to any disclaimer, the term of this patent is extended or adjusted under 35 U.S.C. 154(b) by 0 days.

(21) Appl. No.: 15/161,468

(22) Filed: May 23, 2016

Related U.S. Application Data

(63) Continuation of application No. 14/755,157, filed on Jun. 30, 2015, now Pat. No. 9,378,778.

(60) Provisional application No. 62/175,352, filed on Jun. 14, 2015.

(51) Int. Cl.
*G11C 16/04* (2006.01)
*G11C 11/4074* (2006.01)
*H01L 25/065* (2006.01)
*G11C 11/4094* (2006.01)
*G11C 11/4093* (2006.01)
*G11C 11/4099* (2006.01)

(52) U.S. Cl.
CPC ........ *G11C 11/4074* (2013.01); *G11C 11/4093* (2013.01); *G11C 11/4094* (2013.01); *G11C 11/4099* (2013.01); *H01L 25/0657* (2013.01); *H01L 2225/06544* (2013.01)

(58) Field of Classification Search
CPC .................................................. G11C 16/04
USPC ........................................ 365/185.01–185.33
See application file for complete search history.

(56) References Cited

U.S. PATENT DOCUMENTS

| | | | | |
|---|---|---|---|---|
| 8,320,179 | B2* | 11/2012 | Norman | G11C 8/16 365/185.05 |
| 8,325,539 | B2* | 12/2012 | Park | G11C 7/1051 365/185.22 |
| 8,379,458 | B1* | 2/2013 | Or-Bach | H01L 21/76254 365/177 |
| 2010/0290292 | A1* | 11/2010 | Tanizaki | G11C 16/10 365/185.22 |
| 2013/0100739 | A1* | 4/2013 | Tanizaki | G11C 16/10 365/185.11 |

OTHER PUBLICATIONS

Notice of Allowance dated Apr. 21, 2016 for U.S. Appl. No. 14/755,157 parent to the present application.
U.S. Appl. No. 14/755,157 parent to the present application.

* cited by examiner

*Primary Examiner* — Harry W Byrne

(57) ABSTRACT

A plurality of semiconductor memory devices on a multi-chip package is disclosed. Each semiconductor device may include a plurality of through vias and a plurality of capacitance enhanced through vias. The through vias may provide an electrical connection for signals that may transition between logic states. The capacitance enhanced through vias may provide an electrical connection from a first side to a second side of the respective semiconductor device for transmission signals that remain substantially stable such as reference voltages, power supply voltages or the like. In this way, noise may be reduced and a reservoir of charge for circuits that provide a load for reference voltages and/or power supply voltages may be provided.

20 Claims, 10 Drawing Sheets

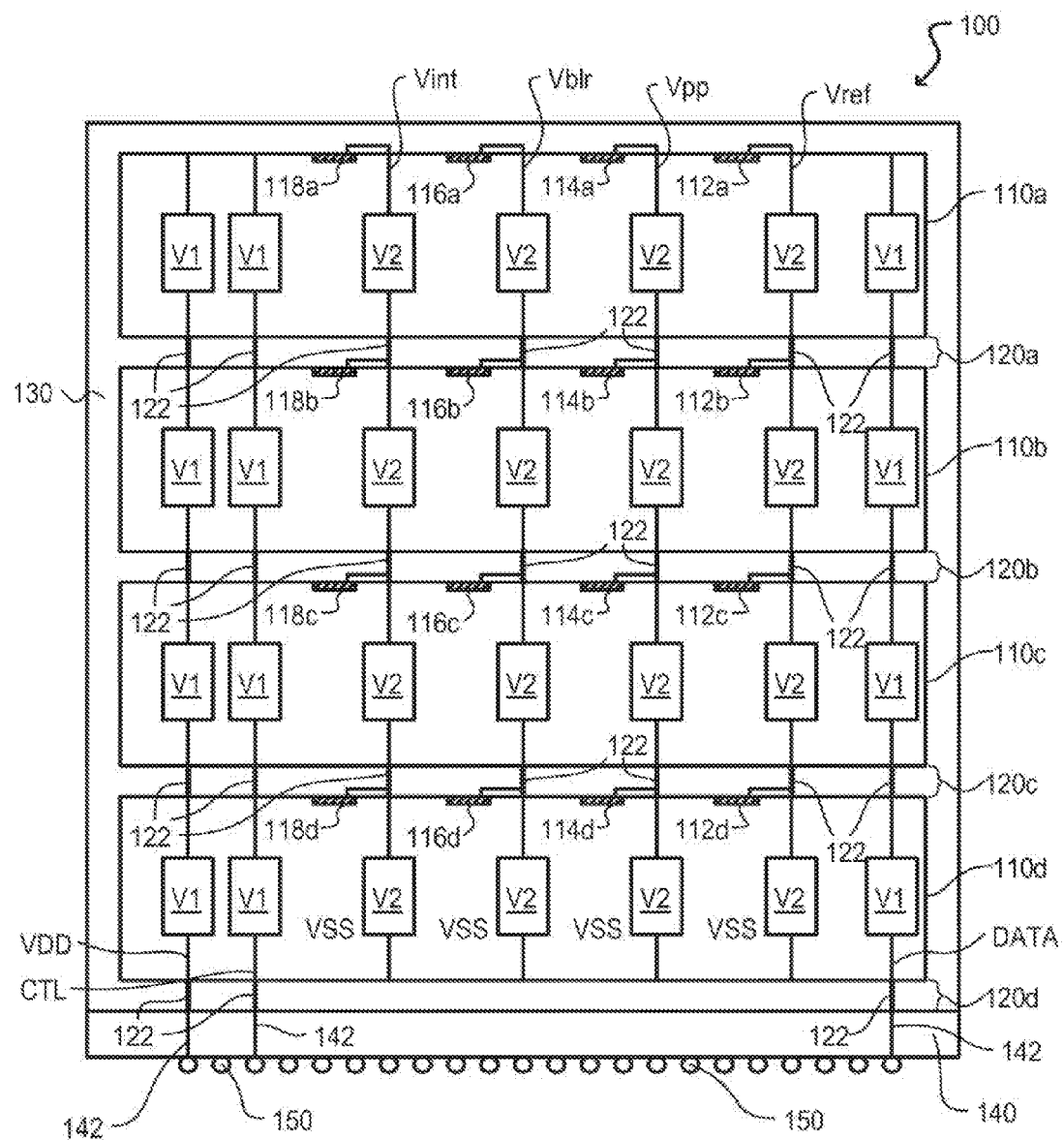
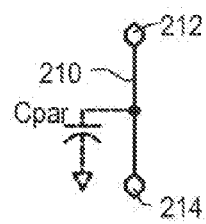
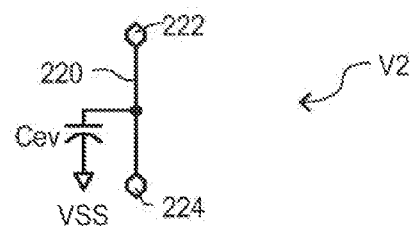
FIG. 1
FIG. 2A
FIG. 2B

US 9,431,088 B1

PACKAGE INCLUDING A PLURALITY OF STACKED SEMICONDUCTOR DEVICES INCLUDING A CAPACITANCE ENHANCED THROUGH VIA AND METHOD OF MANUFACTURE

This application is a continuation of patent application Ser. No. 14/755,157 filed Jun. 30, 2015, which claims the benefit of U.S. Provisional Patent Application Ser. No. 62/175,352, filed Jun. 14, 2015, the contents of which are incorporated by reference herein.

TECHNICAL FIELD

The present invention relates generally to a multi-chip semiconductor device, and more particularly to improving reference generation in a multi-chip semiconductor device.

BACKGROUND OF THE INVENTION

Multi-chip semiconductor packages can include reference voltages and power supply voltages generated on each semiconductor device. Such supplies may be susceptible to independent noise and/or current loads for each semiconductor device which can cause reference voltages and power supply voltages to greatly vary between devices.

In light of the above, it would be desirable to provide a method of generating power supply voltages and/or reference voltages that can be consistent among each semiconductor device in a multi-chip semiconductor device to improve reliability.

BRIEF DESCRIPTION OF THE DRAWINGS

FIG. 1 is a schematic diagram of a package including a plurality of semiconductor devices according to an embodiment.

FIG. 2A is a circuit schematic diagram of a through via according to an embodiment.

FIG. 2B is a circuit schematic diagram of a capacitance enhanced through via according to an embodiment.

DETAILED DESCRIPTION OF THE EMBODIMENTS

Figure 3:
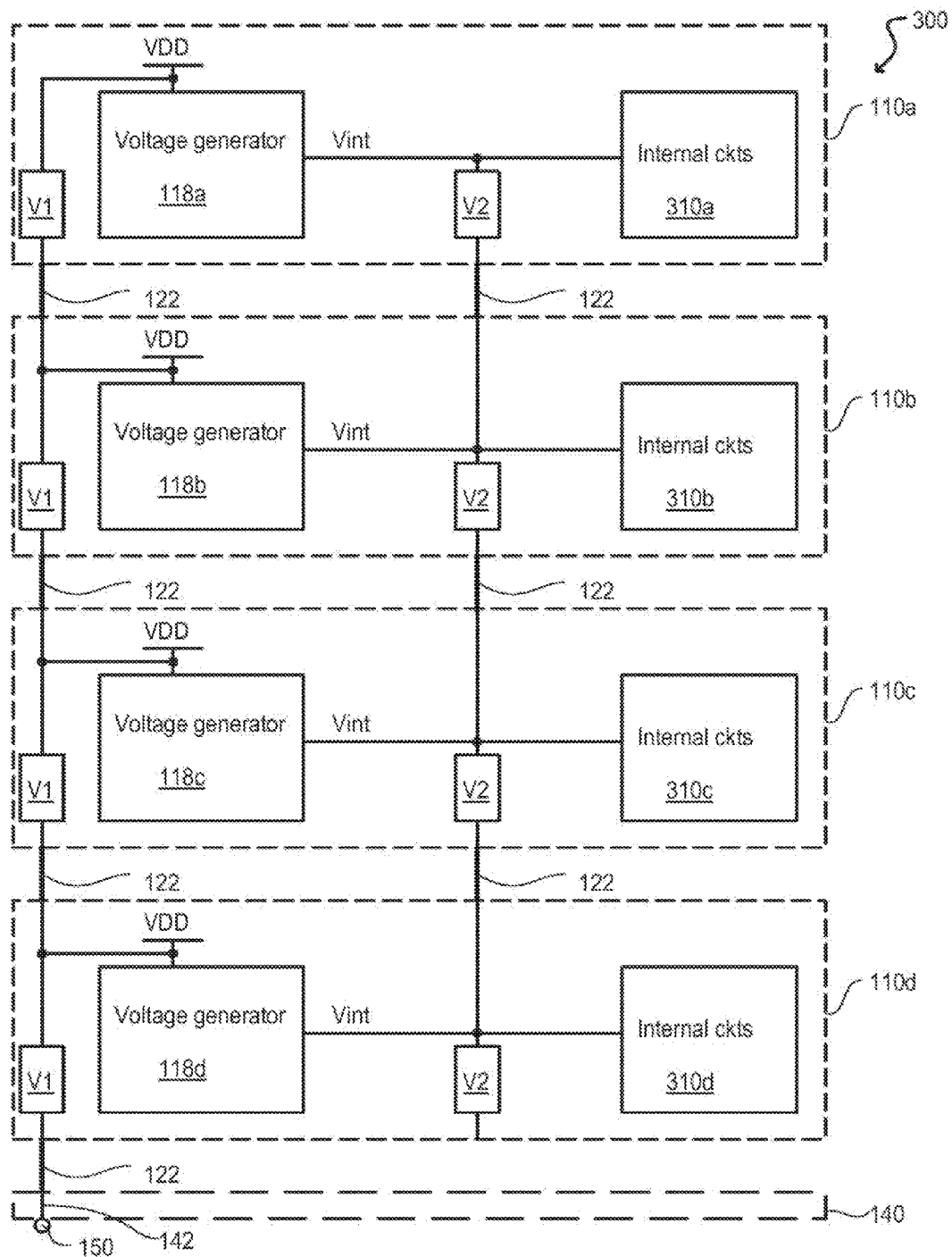
FIG. 3 is a block diagram of a package including a plurality of semiconductor devices according to an embodiment.

According to the embodiments set forth below, a package may include a plurality of semiconductor devices (chips). Each chip may include through vias (through silicon vias—TSV) that can provide an electrical connection between chips and between chips and external connections, such as solder connections or solder balls. The through vias may include capacitance enhanced through vias which may have a capacitance value at least an order of magnitude greater than the non-capacitance enhanced through vias. The capacitance enhanced through vias may be used to route common reference potentials and/or power supply potentials between a plurality of the semiconductor devices. In this way, each semiconductor device may commonly provide current drive for the common reference potentials and/or power supply potentials. Additionally, the capacitance enhanced through vias may include an increased capacitance value which can provide charge storage to provide an instant current to the common reference potential and or power supply potential. In this way, common reference potentials and/or power supply potentials may have reduced noise.

Referring now to FIG. 1, a package including a plurality of semiconductor devices according to an embodiment is set forth in a schematic diagram and given the general reference character 100.

The package 100 can include semiconductor devices (110*a*, 110*b*, 110*c*, and 110*d*) stacked vertically. Each semiconductor device (110*a*, 110*b*, 110*c*, and 110*d*) can include through vias V1 for providing an electrical connection between circuitry and an external connection 150 on a bottom surface of package 100. Through vias V1 can be formed to provide an electrical connection from a front side of a respective semiconductor device (110*a*, 110*b*, 110*c*, and 110*d*) to a back side of the respective semiconductor device (110*a*, 110*b*, 110*c*, and 110*d*).

Each semiconductor device (110*a*, 110*b*, 110*c*, and 110*d*) may also include capacitance enhanced through vias V2 for providing an electrical connection to commonly connected reference potentials and/or power supply potentials between the semiconductor devices (110*a*, 110*b*, 110*c*, and 110*d*) from a front side to a back side of the respective semiconductor device (110*a*, 110*b*, 110*c*, and 110*d*). Each semiconductor device (110*a*, 110*b*, 110*c*, and 110*d*) may include reference voltage generating circuitry and internal power supply generating circuitry. Semiconductor device 110*a* may include a reference voltage generator circuit 112*a* for generating a reference voltage Vref, a power supply voltage generator circuit 114*a* for generating a boosted power supply voltage Vpp, a reference voltage generator circuit 116*a* for generating a bit line reference voltage Vblr, and an internal power supply voltage generator circuit 118*a* for generating an internal power supply voltage Vint. Semiconductor device 110*b* may include a reference voltage generator circuit 112*b* for generating a reference voltage Vref, a power supply voltage generator circuit 114*b* for generating a boosted power supply voltage Vpp, a reference voltage generator circuit 116*b* for generating a bit line reference voltage Vblr, and an internal power supply voltage generator circuit 118*b* for generating an internal power supply voltage Vint. Semiconductor device 110*c* may include a reference voltage generator circuit 112c for generating a reference voltage Vref, a power supply voltage generator circuit 114c for generating a boosted power supply voltage Vpp, a reference voltage generator circuit 116c for generating a bit line reference voltage Vblr, and an internal power supply voltage generator circuit 118c for generating an internal power supply voltage Vint. Semiconductor device 110d may include a reference voltage generator circuit 112d for generating a reference voltage Vref, a power supply voltage generator circuit 114d for generating a boosted power supply voltage Vpp, a reference voltage generator circuit 116d for generating a bit line reference voltage Vblr, and an internal power supply voltage generator circuit 118d for generating an internal power supply voltage Vint.

Interface connections 122 may be formed in regions (120a, 120b, and 120c) between adjacent semiconductor devices (110a-110b, 110b-110c, and 110c-110d) to provide electrical connections between respective through vias V1 and between respective capacitance enhanced through vias V2 of adjacent semiconductor devices (110a-110b, 110b-110c, and 110c-110d). Interface connections 122 may also be formed in a region 120d between semiconductor device 110d and an interposer 140. Interface connections 122 may include solder connections, such as solder balls and/or copper pillars, or the like.

Capacitance enhanced through vias V2 can each include a capacitor formed inside a through hole in which the via resides.

Reference voltage generator circuit 112a can generate a reference voltage Vref which can be electrically connected with wiring layers to a capacitance enhanced through via V2. Reference voltage generator circuit 112b can generate a reference voltage Vref which can be electrically connected with wiring layers to a capacitance enhanced through via V2. Reference voltage generator circuit 112c can generate a reference voltage Vref which can be electrically connected with wiring layers to a capacitance enhanced through via V2. Reference voltage generator circuit 112d can generate a reference voltage Vref which can be electrically connected with wiring layers to a capacitance enhanced through via V2.

Interface connections 122 may electrically connect all capacitance enhanced through vias V2 carrying the reference voltage Vref between semiconductor devices (110a, 110b, 110c, and 110d). In this way, each reference voltage generator circuit (112a, 112b, 112c, and 112d) may provide drive for a common reference voltage Vref and additionally, the reference voltage Vref may have an essentially matching potential between each semiconductor device (110a, 110b, 110c, and 110d). Also, because capacitance enhanced through vias V2 have a substantially large capacitance value than a normal through via V1, a source for charge supply to circuitry receiving the reference voltage circuit Vref may be provided to reduce noise on the reference voltage Vref.

Power supply voltage generator circuit 114a can generate a boosted power supply voltage Vpp which can be electrically connected with wiring layers to a capacitance enhanced through via V2. Power supply voltage generator circuit 114b can generate a boosted power supply voltage Vpp which can be electrically connected with wiring layers to a capacitance enhanced through via V2. Power supply voltage generator circuit 114c can generate a boosted power supply voltage Vpp which can be electrically connected with wiring layers to a capacitance enhanced through via V2. Power supply voltage generator circuit 114d can generate a boosted power supply voltage Vpp which can be electrically connected with wiring layers to a capacitance enhanced through via V2.

Interface connections 122 may electrically connect all capacitance enhanced through vias V2 carrying the boosted power supply voltage Vpp between semiconductor devices (110a, 110b, 110c, and 110d). In this way, each power supply voltage generator circuit (114a, 114b, 114c, and 114d) may provide drive for a common boosted power supply voltage Vpp and additionally, the boosted power supply voltage Vpp may have an essentially matching potential between each semiconductor device (110a, 110b, 110c, and 110d). Also, because capacitance enhanced through vias V2 have a substantially large capacitance value than a normal through via V1, a source for charge supply to circuitry receiving the boosted power supply voltage Vpp may be provided to reduce noise on the boosted power supply voltage Vpp.

Reference voltage generator circuit 116a can generate a bit line reference voltage Vblr which can be electrically connected with wiring layers to a capacitance enhanced through via V2. Reference voltage generator circuit 116b can generate a bit line reference voltage Vblr which can be electrically connected with wiring layers to a capacitance enhanced through via V2. Reference voltage generator circuit 116c can generate a bit line reference voltage Vblr which can be electrically connected with wiring layers to a capacitance enhanced through via V2. Reference voltage generator circuit 116d can generate a bit line reference voltage Vblr which can be electrically connected with wiring layers to a capacitance enhanced through via V2.

Interface connections 122 may electrically connect all capacitance enhanced through vias V2 carrying the bit line reference voltage Vblr between semiconductor devices (110a, 110b, 110c, and 110d). In this way, each reference voltage generator circuit (116a, 116b, 116c, and 116d) may provide drive for a common bit line reference voltage Vblr and additionally, the bit line reference voltage Vblr may have an essentially matching potential between each semiconductor device (110a, 110b, 110c, and 110d). Also, because capacitance enhanced through vias V2 have a substantially large capacitance value than a normal through via V1, a source for charge supply to circuitry receiving the bit line reference voltage Vblr may be provided to reduce noise on the bit line reference voltage Vblr.

Internal power supply voltage generator circuit 118a can generate an internal power supply voltage Vint which can be electrically connected with wiring layers to a capacitance enhanced through via V2. Internal power supply voltage generator circuit 118b can generate an internal power supply voltage Vint which can be electrically connected with wiring layers to a capacitance enhanced through via V2. Internal power supply voltage generator circuit 118c can generate an internal power supply voltage Vint which can be electrically connected with wiring layers to a capacitance enhanced through via V2. Internal power supply voltage generator circuit 118d can generate an internal power supply voltage Vint which can be electrically connected with wiring layers to a capacitance enhanced through via V2.

Interface connections 122 may electrically connect all capacitance enhanced through vias V2 carrying the internal power supply voltage Vint between semiconductor devices (110a, 110b, 110c, and 110d). In this way, each internal power supply voltage generator circuit (118a, 118b, 118c, and 118d) may provide drive for a common internal power supply voltage Vint and additionally, the internal power supply voltage Vint may have an essentially matching potential between each semiconductor device (110a, 110b, 110c, and 110d). Also, because capacitance enhanced through vias V2 have a substantially large capacitance value than a normal through via V1, a source for charge supply to circuitry receiving the internal power supply voltage Vint may be provided to reduce noise on the internal power supply voltage Vint.

Signals and voltages that are provided to/from the package 100 and external connections 150 may be electrically connected to through vias V1 by way of wiring 142 formed in interposer 140 and interface connections 122 formed in regions (120a to 120d). Signals and voltages can include a power supply voltage VDD, control signals CTL, and data signals DATA.

Through vias V1 may provide an electrical connection for signals that may transition between logic states, such as control signals CTL and data signals DATA. Capacitance enhanced through vias V2 may provide an electrical connection from a first side to a second side of the respective semiconductor device for transmission of signals that remain substantially stable such as reference voltages (Vref and Vblr), power supply voltages (Vint and Vpp) or the like. In this way, noise may be reduced and a reservoir of charge for circuits that provide a load for reference voltages and/or power supply voltages may be provided.

Referring now to FIG. 2A, a circuit schematic diagram of a through via V1 according to an embodiment is set forth. Through via V1 can include a wiring layer 210 having first and second terminals (212 and 214). The wiring layer 210 may also have a parasitic capacitance Cpar. The parasitic capacitance Cpar may essentially be a capacitance formed from the wiring layer 210 to a substrate of a semiconductor device. It may be desirable for parasitic capacitance Cpar to be as small as possible so that signals may be transmitted and transition as fast as possible and current consumption may be reduced.

Referring now to FIG. 2B, a circuit schematic diagram of a capacitance enhanced through via V2 according to an embodiment is set forth. Capacitance enhanced through via V2 can include a wiring layer 220 having first and second terminals (222 and 224). The wiring layer 210 may also have a capacitance Cev. The capacitance Cev may be a capacitance formed using the wiring layer 220 as a first capacitor terminal and a second conductor layer as a second capacitor terminal. The wiring layer 220 and the conductor layer may be separated by a thin dielectric layer. The conductor layer may be connected to a ground potential VSS. In this way, capacitance Cev of capacitance enhanced through via V2 may have a capacitance value that is substantially greater than parasitic capacitance Cpar of through via V1. In particular, the capacitance value of capacitance Cev of capacitance enhanced through via V2 may be at least an order of magnitude (i.e. 10×) greater than the capacitance value of parasitic capacitance Cpar of through via V1.

Referring now to FIG. 3, a package including a plurality of semiconductor devices according to an embodiment is set forth in a block schematic diagram and given the general reference character 300. Package 300 can include similar constituents as package 100 of FIG. 1, such constituents may be referred to by the same reference character. FIG. 3 illustrates aspects of internal power supply voltage generator circuits (118a to 118d) for package 100 of FIG. 1.

Package 300 can include semiconductor devices (110a, 110b, 110c, and 110d) and an interposer 140. Semiconductor device 110a may include through vias V1, capacitance enhanced through vias V2, an internal power supply voltage generator circuit 118a, and internal circuits 310a. Internal power supply voltage generator 118a can be electrically connected to receive a power supply voltage VDD from through via V1 and may provide an internal power supply voltage Vint as an output. Internal circuits 310a may be electrically connected to receive internal power supply voltage Vint. Internal power supply voltage Vint may be electrically connected to capacitance enhanced through via V2. Semiconductor device 110b may include through vias V1, capacitance enhanced through vias V2, an internal power supply voltage generator circuit 118b, and internal circuits 310b. Voltage generator circuit 118b can be electrically connected to receive a power supply voltage VDD from through via V1 and may provide an internal power supply voltage Vint as an output. Internal circuits 310b may be electrically connected to receive internal power supply voltage Vint. Internal power supply voltage Vint may be electrically connected to capacitance enhanced through via V2. Semiconductor device 110c may include through vias V1, capacitance enhanced through vias V2, an internal power supply voltage generator 118c, and internal circuits 310c. Internal power supply voltage generator circuit 118c can be electrically connected to receive a power supply voltage VDD from through via V1 and may provide an internal power supply voltage Vint as an output. Internal circuits 310c may be electrically connected to receive internal power supply voltage Vint. Internal power supply voltage Vint may be electrically connected to capacitance enhanced through via V2. Semiconductor device 110d may include through vias V1, capacitance enhanced through vias V2, an internal power supply voltage generator circuit 118d, and internal circuits 310d. Internal power supply voltage generator circuit 118d can be electrically connected to receive a power supply voltage VDD from through via V1 and may provide an internal power supply voltage Vint as an output. Internal circuits 310d may be electrically connected to receive internal power supply voltage Vint. Internal power supply voltage Vint may be electrically connected to capacitance enhanced through via V2.

Package 300 may receive power supply voltage VDD, externally from an external connection 150. Only one external connection 150 is illustrated to avoid unduly cluttering up the figure. Power supply voltage VDD may be electrically connected to respective internal power supply voltage generator circuits (118a, 118b, 118c, and 118d) by way of wiring 142 through interposer 140, interface connections 122, and through vias V1.

Internal power supply voltage generator circuits (118a, 118b, 118c, and 118d) may operate to collectively and in parallel provide a commonly connected internal power supply voltage Vint. Internal power supply voltage Vint may be commonly connected by way of interface connections 122 and capacitance enhanced through vias V2. By commonly generating and commonly connecting internal power supply voltage Vint using internal power supply voltage generator circuits (118a, 118b, 118c, and 118d), each internal power supply voltage generator circuit (118a, 118b, 118c, and 118d) may be made smaller (i.e. lower drive strength) than in conventional semiconductor devices because each internal power supply voltage generator circuit (118a, 118b, 118c, and 118d) may only provide a portion of the current required by an active internal circuit.

Because internal circuits (310a, 310b, 310c, and 310d) are commonly electrically connected to receive internal power supply voltage Vint, the load may be distributed.

Due to increased capacitance value of capacitance enhanced through vias V2 electrically connected to receive and transmit internal power supply voltage Vint, essentially instantaneous charge may be locally available for each semiconductor device (110a, 110b, 110c, and 110d) and noise may be reduced and/or attenuated.

Figure 4:
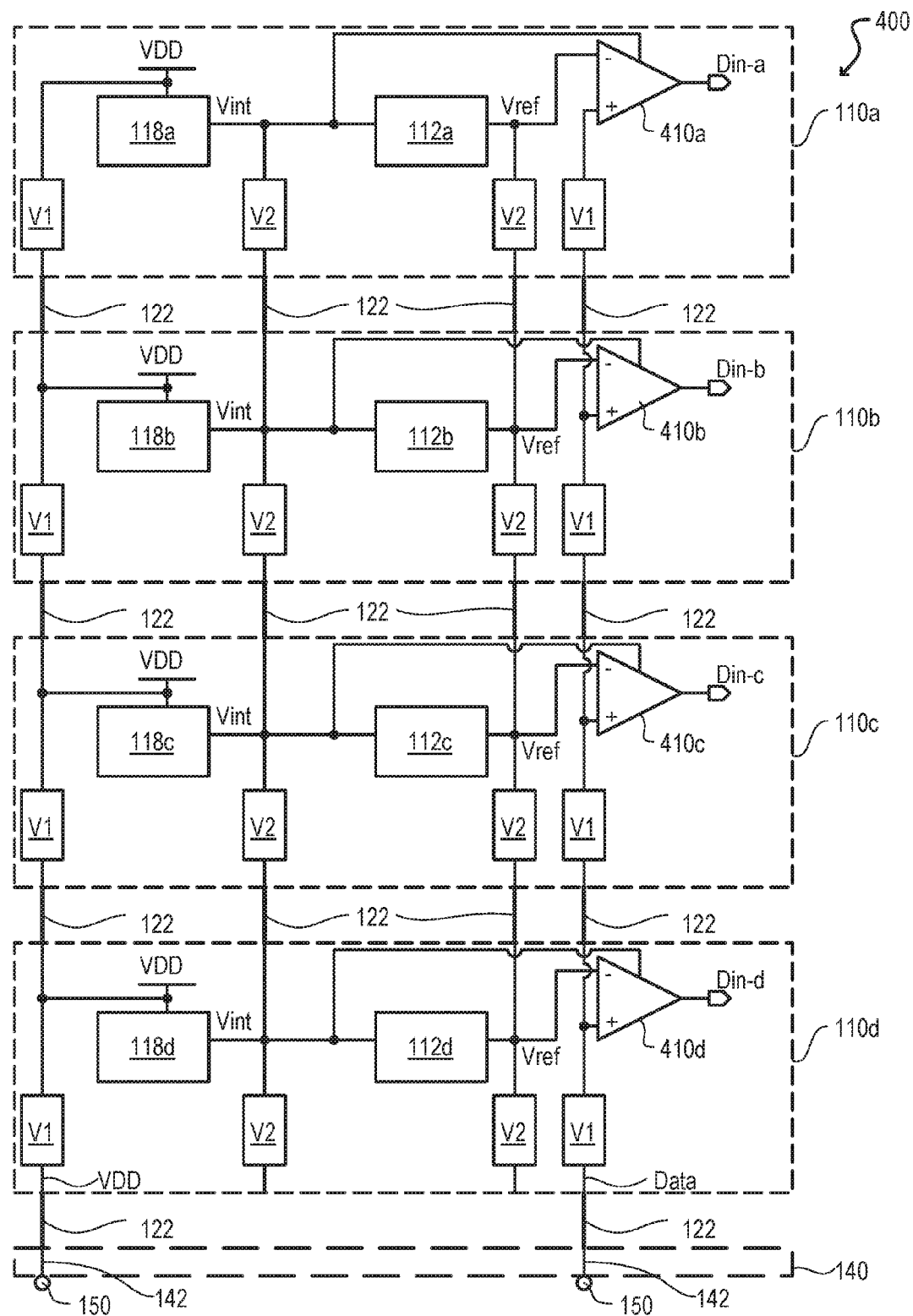
FIG. 4 is a block diagram of a package including a plurality of semiconductor devices according to an embodiment.

Referring now to FIG. 4, a package including a plurality of semiconductor devices according to an embodiment is set forth in a block schematic diagram and given the general reference character 400. Package 400 can include similar constituents as package 100 of FIG. 1, such constituents may be referred to by the same reference character. FIG. 4 illustrates aspects of internal power supply voltage generator circuits (118a to 118d) and reference voltage generator circuits (112a to 112d) for package 100 of FIG. 1.

Package 400 can include semiconductor devices (110a, 110b, 110c, and 110d). Each semiconductor device (110a to 110d) can respectively include internal power supply voltage generator circuits (118a to 118d) arranged as discussed above with respect to package 300 of FIG. 3. Each semiconductor device (110a to 110d) can respectively include a respective reference voltage generator circuit (112a to 112d) and input buffer circuit (410a to 410d).

In semiconductor device 110a, internal power supply voltage Vint may be provided to reference voltage generator 112a. Reference voltage generator circuit 112a can provide a reference voltage Vref. An input buffer circuit 410a may receive reference voltage Vref at a first input terminal (a negative input terminal). Input buffer circuit 410a may receive a data signal DATA at a second input terminal (a positive input terminal). Data signal DATA may be provided externally from an external connection 150 and through electrical connection 142, interface connections 122 and through vias V1. Input buffer circuit 410a may provide a data signal Din-a as an output.

In semiconductor device 110b, internal power supply voltage Vint may be provided to reference voltage generator 112b. Reference voltage generator circuit 112b can provide a reference voltage Vref. An input buffer circuit 410b may receive reference voltage Vref at a first input terminal (a negative input terminal). Input buffer circuit 410b may receive a data signal DATA at a second input terminal (a positive input terminal). Data signal DATA may be provided externally from an external connection 150 and through electrical connection 142, interface connections 122 and through vias V1. Input buffer circuit 410b may provide a data signal Din-b as an output.

In semiconductor device 110c, internal power supply voltage Vint may be provided to reference voltage generator circuit 112c. Reference voltage generator circuit 112c can provide a reference voltage Vref. An input buffer circuit 410c may receive reference voltage Vref at a first input terminal (a negative input terminal). Input buffer circuit 410c may receive a data signal DATA at a second input terminal (a positive input terminal). Data signal DATA may be provided externally from an external connection 150 and through electrical connection 142, interface connections 122 and through vias V1. Input buffer circuit 410c may provide a data signal Din-c as an output.

In semiconductor device 110d, internal power supply voltage Vint may be provided to reference voltage generator 112d. Reference voltage generator circuit 112d can provide a reference voltage Vref. An input buffer circuit 410d may receive reference voltage Vref at a first input terminal (a negative input terminal). Input buffer circuit 410d may receive a data signal DATA at a second input terminal (a positive input terminal). Data signal DATA may be provided externally from an external connection 150 and through electrical connection 142, interface connections 122 and through vias V1. Input buffer circuit 410d may provide a data signal Din-d as an output.

Reference voltage generator circuits (112a, 112b, 112c, and 112d) may operate to collectively and in parallel provide a commonly connected reference voltage Vref. Reference voltage Vref may be commonly connected by way of interface connections 122 and capacitance enhanced through vias V2. By commonly generating and commonly connecting reference voltage Vref using reference voltage generator circuits (112a, 112b, 112c, and 112d), each reference voltage generator circuit (112a, 112b, 112c, and 112d) may be made smaller (i.e. lower drive strength) than in conventional semiconductor devices because each reference voltage generator circuit (112a, 112b, 112c, and 112d) may only provide a portion of the current required by an active internal circuit.

Because input buffer circuits (410a, 410b, 410c, and 410d) are commonly electrically connected to receive reference voltage Vref and data signal DATA, input levels of data signal DATA may be read consistently among the different semiconductor devices (110a, 110b, 110c, and 110d). In this way, input noise margin levels may be improved and data reliability may be improved.

Due to increased capacitance value of capacitance enhanced through vias V2 electrically connected to receive and transmit reference voltage Vint, essentially instantaneous charge may be locally available for each semiconductor device (110a, 110b, 110c, and 110d) and noise may be reduced and/or attenuated.

Figure 5:
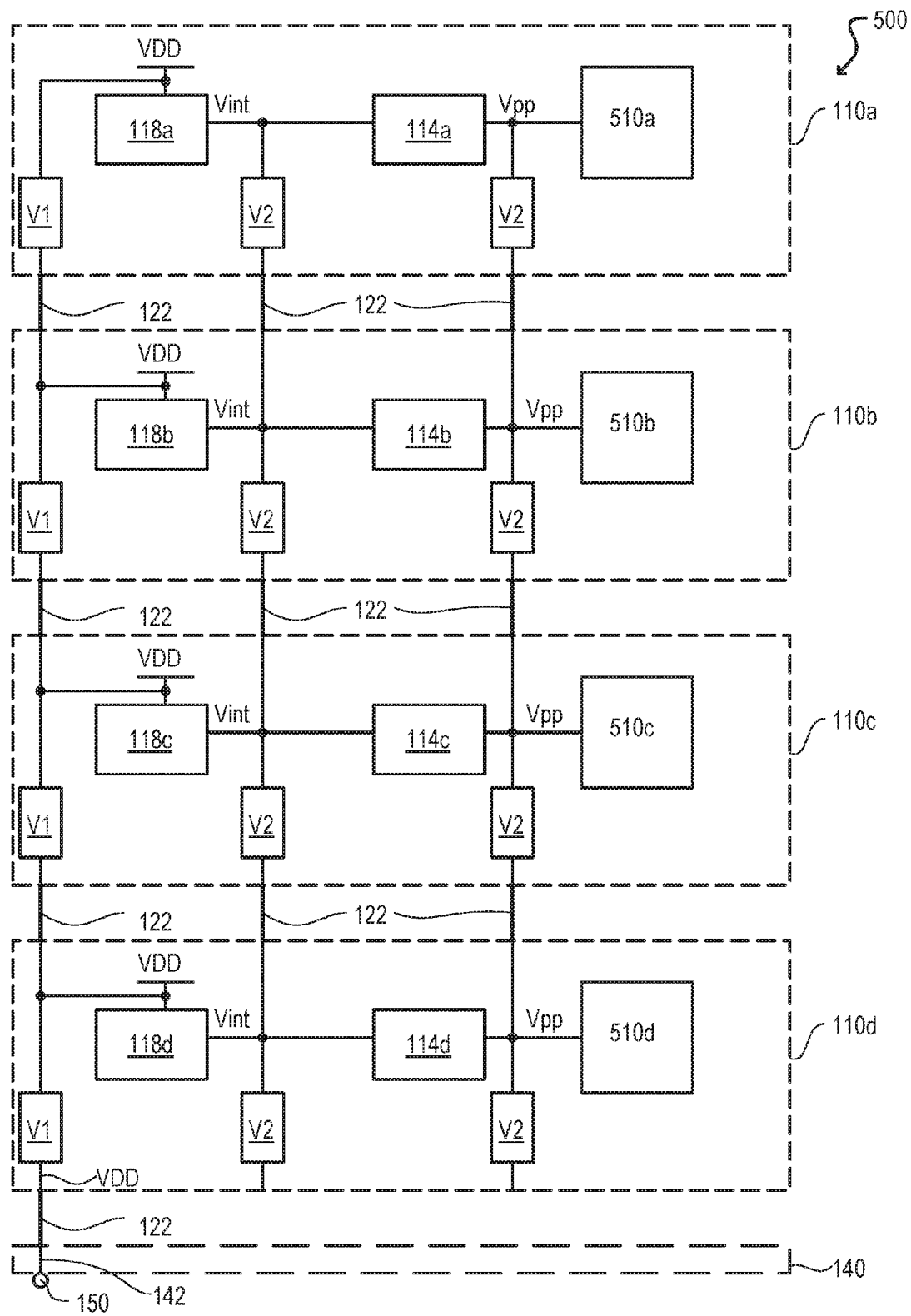
FIG. 5 is a block diagram of a package including a plurality of semiconductor devices according to an embodiment.

Referring now to FIG. 5, a package including a plurality of semiconductor devices according to an embodiment is set forth in a block schematic diagram and given the general reference character 500. Package 500 can include similar constituents as package 100 of FIG. 1, such constituents may be referred to by the same reference character. FIG. 5 illustrates aspects of power supply voltage generator circuits (118a to 118d) and power supply voltage generator circuits (114a to 114d) for package 100 of FIG. 1.

Package 500 can include semiconductor devices (110a, 110b, 110c, and 110d). Each semiconductor device (110a to 110d) can respectively include voltage generator circuits (118a to 118d) arranged as discussed above with respect to package 300 of FIG. 3. Each semiconductor device (110a to 110d) can respectively include a power supply voltage generator circuit (114a to 114d) and memory array circuits (510a to 510d).

In semiconductor device 110a, internal power supply voltage Vint may be provided to power supply voltage generator circuit 114a. Power supply voltage generator circuit 114a can provide a boosted power supply voltage Vpp. A memory array circuit 510a may receive boosted power supply voltage Vpp. Boosted power supply voltage Vpp may be used to drive word lines (not shown) in memory array circuit 510a.

In semiconductor device 110b, internal power supply voltage Vint may be provided to power supply voltage generator circuit 114b. Power supply voltage generator circuit 114b can provide a boosted power supply voltage Vpp. A memory array circuit 510b may receive boosted power supply voltage Vpp. Boosted power supply voltage Vpp may be used to drive word lines (not shown) in memory array circuit 510b.

In semiconductor device 110c, internal power supply voltage Vint may be provided to power supply voltage generator circuit 114c. Power supply voltage generator circuit 114c can provide a boosted power supply voltage Vpp. A memory array circuit 510c may receive boosted power supply voltage Vpp. Boosted power supply voltage Vpp may be used to drive word lines (not shown) in memory array circuit 510c.

In semiconductor device 110d, internal power supply voltage Vint may be provided to power supply voltage generator circuit 114d. Power supply voltage generator circuit 114d can provide a boosted power supply voltage Vpp. A memory array circuit 510d may receive boosted power supply voltage Vpp. Boosted power supply voltage Vpp may be used to drive word lines (not shown) in memory array circuit 510d.

Power supply voltage generator circuits (114a, 114b, 114c, and 114d) may operate to collectively and in parallel provide a commonly connected boosted power supply voltage Vpp. Boosted power supply voltage Vpp may be commonly connected by way of interface connections 122 and capacitance enhanced through vias V2. By commonly generating and commonly connecting boosted power supply voltage Vpp using power supply voltage generator circuits (114a, 114b, 114c, and 114d), each power supply voltage generator circuit (114a, 114b, 114c, and 114d) may be made smaller (i.e. lower drive strength) than in conventional semiconductor devices because each boosted power supply voltage generator circuit (114a, 114b, 114c, and 114d) may only provide a portion of the current required by an active internal circuit.

Boosted power supply voltage Vpp may provide a high level of a word line in memory array circuits (510a to 510d). Because boosted power supply voltage Vpp is commonly connected between semiconductor devices (110a, 110b, 110c, and 110d), a similar potential may be written into memory cells (dynamic random access memory cells) in memory array circuits (510a, 510b, 510c, and 510d). In this way, parameters such as pause-refresh timing may be consistent between devices and reliability may be improved.

Due to increased capacitance value of capacitance enhanced through vias V2 electrically connected to receive and transmit boosted power supply voltage Vpp, essentially instantaneous charge may be locally available for each semiconductor device (110a, 110b, 110c, and 110d) and noise may be reduced and/or attenuated.

Boosted power supply voltage Vpp may have a potential greater than internal power supply potential Vint and power supply voltage generator circuits (114a, 114b, 114c, and 114d) may include voltage pumps including boost capacitors.

Figure 6:
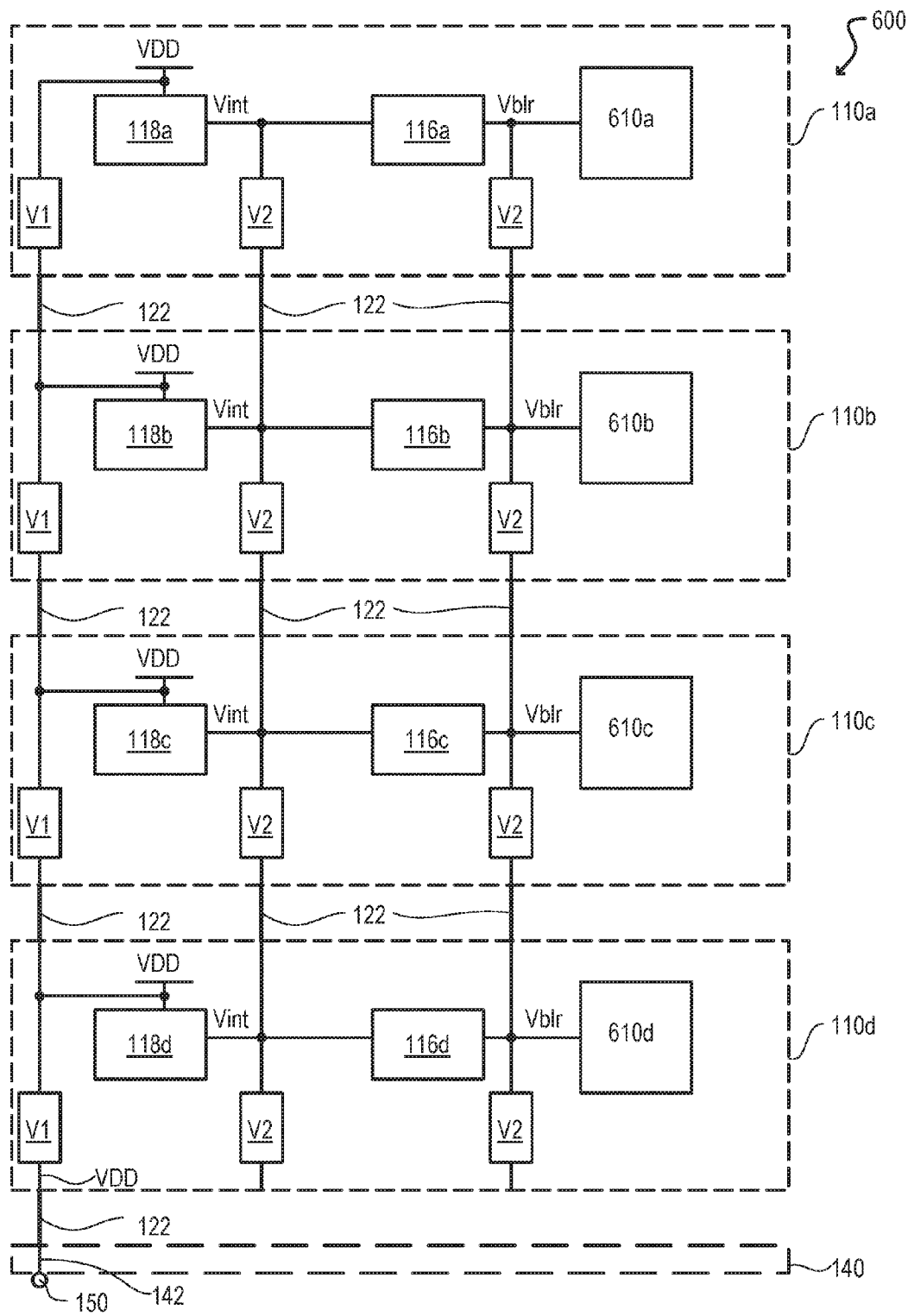
FIG. 6 is a block diagram of a package including a plurality of semiconductor devices according to an embodiment.

Referring now to FIG. 6, a package including a plurality of semiconductor devices according to an embodiment is set forth in a block schematic diagram and given the general reference character 600. Package 600 can include similar constituents as package 100 of FIG. 1, such constituents may be referred to by the same reference character. FIG. 6 illustrates aspects of voltage generator circuits (118a to 118d) and reference voltage generator circuits (116a to 116d) for package 100 of FIG. 1.

Package 600 can include semiconductor devices (110a, 110b, 110c, and 110d). Each semiconductor device (110a to 110d) can respectively include voltage generator circuits (118a to 118d) arranged as discussed above with respect to package 300 of FIG. 3. Each semiconductor device (110a to 110d) can respectively include a reference voltage generator circuit (116a to 116d) and memory array circuits (610a to 610d).

In semiconductor device 110a, internal power supply voltage Vint may be provided to reference voltage generator circuit 116a. Reference voltage generator circuit 116a can provide a bit line reference voltage Vblr. A memory array circuit 610a may receive bit line reference voltage Vblr. Bit line reference voltage Vblr may be used to precharge bit lines (not shown) in memory array circuit 610a.

In semiconductor device 110b, internal power supply voltage Vint may be provided to reference voltage generator circuit 116b. Reference voltage generator circuit 116b can provide a bit line reference voltage Vblr. A memory array circuit 610b may receive bit line reference voltage Vblr. Bit line reference voltage Vblr may be used to precharge word lines (not shown) in memory array circuit 610b.

In semiconductor device 110c, internal power supply voltage Vint may be provided to reference voltage generator circuit 116c. Reference voltage generator circuit 116c can provide a bit line reference voltage Vblr. A memory array circuit 610c may receive bit line reference voltage Vblr. Bit line reference voltage Vblr may be used to precharge word lines (not shown) in memory array circuit 610c.

In semiconductor device 110d, internal power supply voltage Vint may be provided to reference voltage generator circuit 116d. Reference voltage generator circuit 116d can provide a bit line reference voltage Vblr. A memory array circuit 610d may receive bit line reference voltage Vblr. Bit line reference voltage Vblr may be used to precharge word lines (not shown) in memory array circuit 610d.

Reference voltage generator circuits (116a, 116b, 116c, and 116d) may operate to collectively and in parallel provide a commonly connected bit line reference voltage Vblr. Bit line reference voltage Vblr may be commonly connected by way of interface connections 122 and capacitance enhanced through vias V2. By commonly generating and commonly connecting bit line reference voltage Vblr using reference voltage generator circuits (116a, 116b, 116c, and 116d), each reference voltage generator circuit (116a, 116b, 116c, and 116d) may be made smaller (i.e. lower drive strength) than in conventional semiconductor devices because each reference voltage generator circuit (116a, 116b, 116c, and 116d) may only provide a portion of the current required by an active internal circuit.

Bit line reference voltage Vblr may provide a precharge potential to bit lines in memory array circuits (610a to 610d). Because bit line reference voltage Vblr is commonly connected between semiconductor devices (110a, 110b, 110c, and 110d), a similar potential may be precharged in bit lines in memory array circuits (610a, 610b, 610c, and 610d). In this way, parameters such as data integrity and pause-refresh timing may be consistent between devices and reliability may be improved.

Due to increased capacitance value of capacitance enhanced through vias V2 electrically connected to receive and transmit bit line reference voltage Vblr, essentially instantaneous charge may be locally available for each semiconductor device (110a, 110b, 110c, and 110d) and noise may be reduced and/or attenuated.

Bit line reference voltage Vblr may have a potential less than internal power supply potential Vint and have a potential that is essentially midway between internal power supply potential Vint and a reference potential such as a ground potential.

Figure 7:
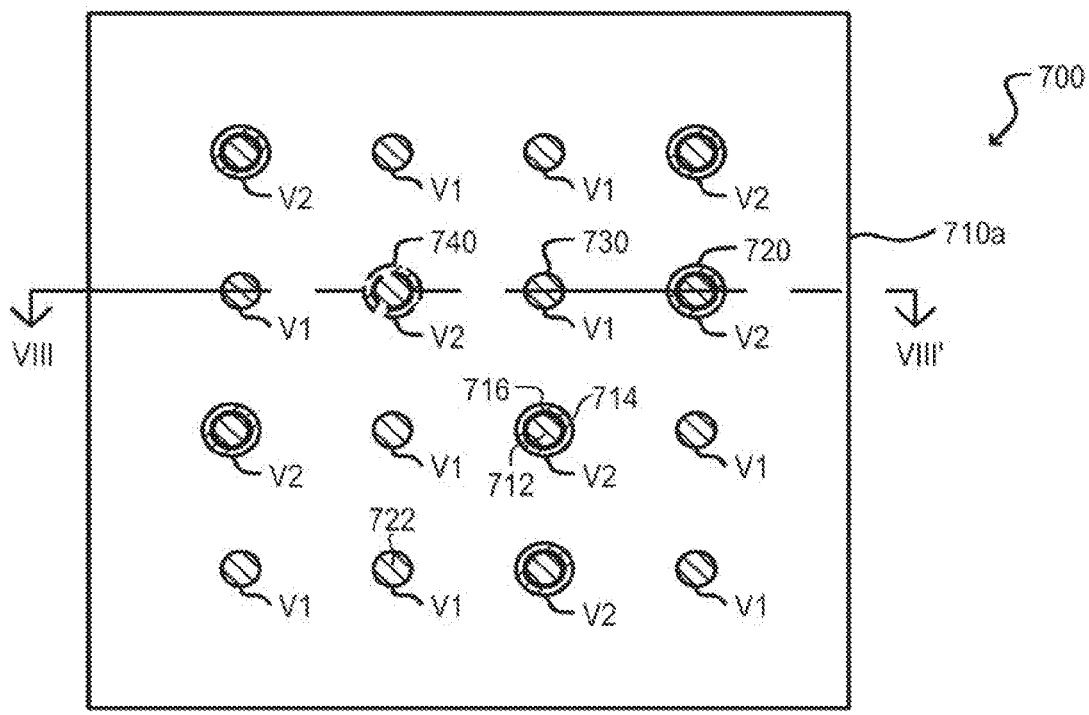
FIG. 7 is a top plan view of a package including a plurality of semiconductor devices according to an embodiment.

Referring now to FIG. 7, a top plan view of a package including a plurality of semiconductor devices according to an embodiment is set forth and given the general reference character 700.

The top view of package 700 illustrates a top surface of an upper most semiconductor device 710a.

Package 700 includes through vias V1 and capacitance enhanced through vias V2 arranged in an array.

Each through via V1 can include a conductive material 722 providing an electrical connection through a semiconductor device.

Each capacitance enhanced through via V2 can include a conductive material 712, a conductive material 714, and a dielectric material 716. The conductive material 712 can provide an electrical connection through a semiconductor device. The conductive material 712 can provide a first capacitor node and the conductive material 714 can provide a second capacitor node. Dielectric material 716 can be formed between conductive material 712 and conductive material 714. In this way, each capacitance enhance through via V2 may include a capacitor having a first terminal formed from conductive material 712 and a second terminal formed by conductive material 714.

Conductive material 714 may be an annular shape surrounding conductive material 712 and separated by dielectric material 716. Conductive material 712 may have an annular outer surface. Dielectric material 716 may have an annular shape.

Package 700 includes a capacitance enhanced through via formed in region 720, a through via formed in region 730, and a capacitance enhance through via formed in region 740 shown along the line VIII-VIII'.

Figure 8:
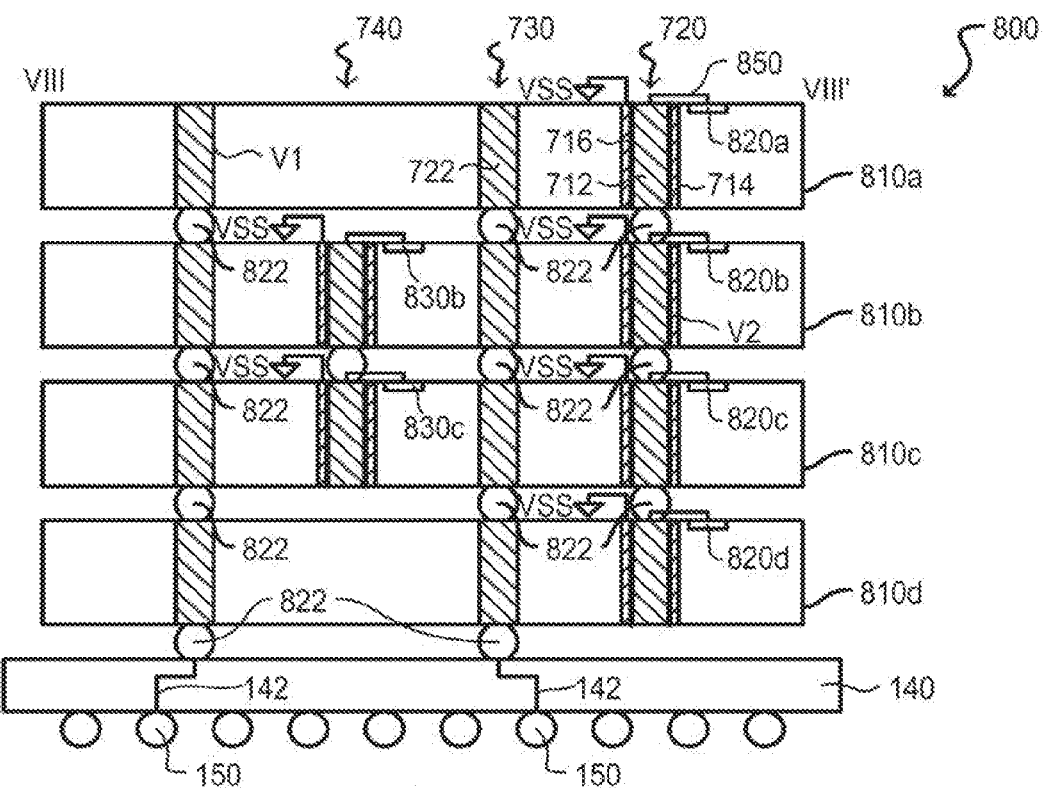
FIG. 8 is a cross sectional diagram of a package including a plurality of semiconductor devices according to an embodiment.

Referring now to FIG. 8, a cross sectional diagram of a package including a plurality of semiconductor devices according to an embodiment is set forth and given the general reference character 800. Package 800 of FIG. 8 illustrates a cross-section of package 700 along the line VIII-VIII'.

Package 800 can include a semiconductor device 810a, a semiconductor device 810b, a semiconductor device 810c, and a semiconductor device 810d. Semiconductor device 810a may correspond to semiconductor device 710a in package 700 of FIG. 7. Package 800 may also include an interposer 140.

Semiconductor device 810a may include a capacitance enhanced through via V2 formed in region 720 and a through via V1 formed in region 730. Each capacitance enhanced through via V2 may include a first conductive material 712 and a second conductive material 714, with a dielectric layer 716 formed there between. The second conductive material 714 may be electrically connected to a ground potential VSS. In this way, second conductive material 714 may provide a first terminal for a capacitor and first conductive material 712 may provide both a second terminal for a capacitor and a conductive trace for a voltage, such as an internal power supply voltage Vint, a boosted power supply voltage Vpp, a reference voltage Vref, and/or a bit line reference voltage Vblr, or the like that may be commonly generated by and provided to semiconductor devices (810a, 810b, 810c, and 810d).

Interface connections 822 may provide electrical connections between vertically adjacent through vias V1 and between vertically adjacent capacitance enhanced through vias V2. In particular, interface connections 822 may provide electrical connections between first conductive material 712 of vertically adjacent capacitance enhanced through vias V2 and interface connections 822 may provide electrical connections between conductive material 722 of vertically adjacent through vias V1.

Through vias V1 in conjunction with interface connections 822, wiring 142 and external connections 150 may provide an electrical connection to external signals (such as data and control signals) and supply potentials such as power supply VDD and ground potential VSS.

Each semiconductor device (810a, 810b, 810c, and 810d) may include a respective internal circuit (820a, 820b, 820c, and 820d). Each internal circuit (820a, 820b, 820c, and 820d) may be electrically connected to a capacitance enhanced through via V2 by way of a wiring 850. Internal circuits (820a, 820b, 820c, and 820d) may correspond with a respective internal power supply generator circuit (118a, 118b, 118c, and 118d), power supply generator circuit (114a, 114b, 114c, and 114d), reference generator circuit (112a, 112b, 112c, and 112d), and/or bit line reference generator circuit (116a, 116b, 116c, and 116d) illustrated in FIG. 1.

Semiconductor devices (810b and 810c) may include internal circuits (830b and 830c), respectively. Internal circuits (830b and 830c) may be electrically connected to a respective capacitance enhanced through via V2 by way of wiring 850. In this way, second conductive material 714 may provide a first terminal for a capacitor and first conductive material 712 may provide both a second terminal for a capacitor and a conductive trace for a voltage, such as an internal power supply voltage Vint, a boosted power supply voltage Vpp, a reference voltage Vref, and/or a bit line reference voltage Vblr, or the like that can be commonly generated by and provided to semiconductor devices (810b and 810c), exclusively.

Capacitance enhance through via V2 formed in the bottom semiconductor device 810d of the stack of semiconductor devices (810a to 810d) may not be electrically connected to a interface connection 822 on a bottom surface of the semiconductor device 810d.

FIGS. 9A to 9I are cross-sectional diagrams of a semiconductor device at various process steps of forming through vias and capacitance enhanced through vias according to an embodiment.

Figure 9A:
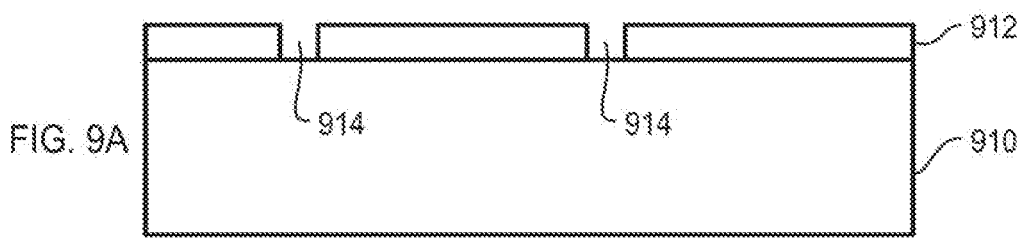
FIGS. 9A to 9I are cross-sectional diagrams of a semiconductor device at various process steps of forming through vias and capacitance enhanced through vias according to an embodiment.

Referring now to FIG. 9A, in a first step, a mask layer 912 may be formed and patterned on a substrate 910 to form openings 914 in mask layer 912.

Figure 9B:
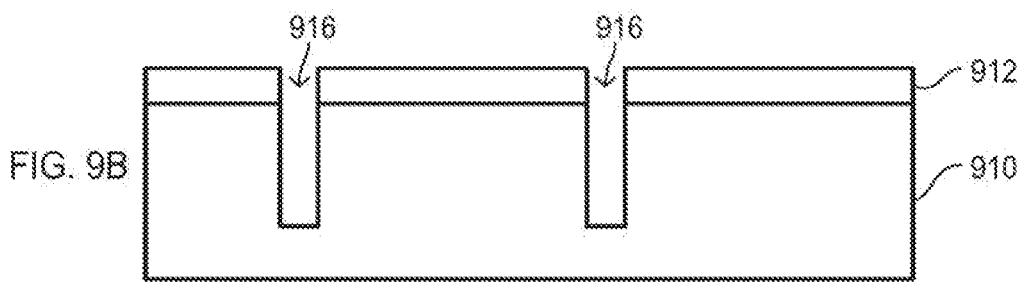

Referring now to FIG. 9B, in a next step, a deep trench 916 may be etched in the substrate 910 through openings 914 in an anisotropic process. The deep trench 916 may have an annular shape from a top view.

Figure 9C:
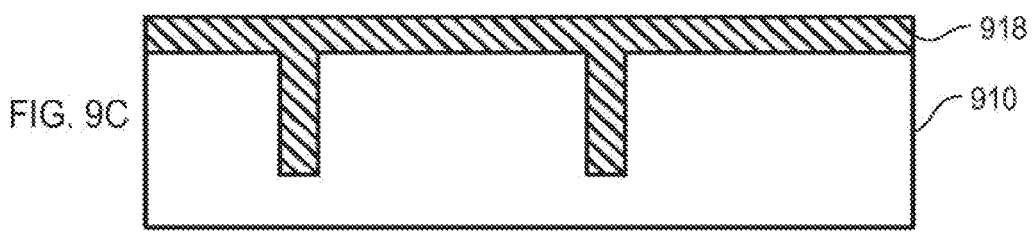

Referring now to FIG. 9C, in a next step, mask layer 912 may be removed and an oxide layer (not shown) may be deposited or grown on the surface including a surface of deep trench 916 followed by the deposition of a conductive material 918 being deposited over the entire surface of substrate 910 to fill deep trench 916. Conductive material 918 may include at least one material selected from the group consisting of: polysilicon, copper, aluminum, cobalt, nickel, and titanium.

Figure 9D:
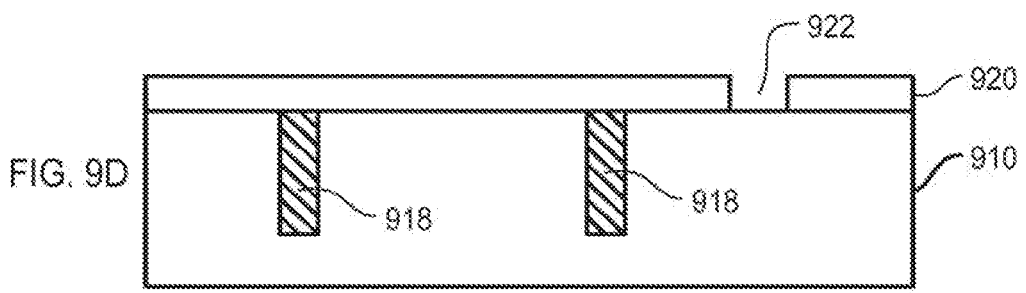

Referring now to FIG. 9D, in a next step, a chemical mechanical polishing process may be used to remove the conductive material 918 from the upper surface of substrate 910, leaving conductive material 918 in the deep trench. In a next step, a mask layer 920 may be formed and patterned on the upper surface of substrate 910 to form openings 922 in mask layer 920.

Figure 9E:
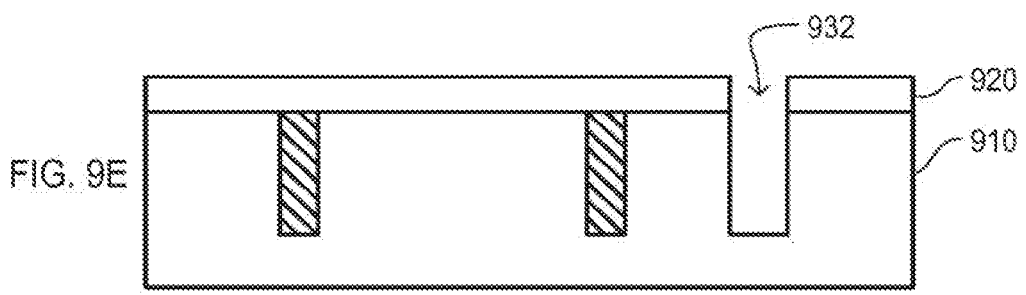

Referring now to FIG. 9E, in a next step, a deep trench 932 may be etched in the substrate 910 through openings 922 in an anisotropic process. Deep trench 932 may have an annular shape from a top view.

Figure 9F:
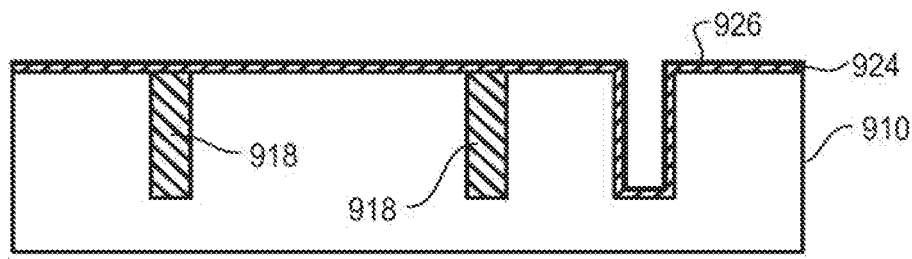

Referring now to FIG. 9F, in a next step, mask layer 920 may be removed and an oxide layer (not shown) may be deposited or grown on the surface including a surface of deep trench 932 followed by the deposition of a conductive material 924 being deposited over the entire surface of substrate 910 including the surface of deep trench 932. Next, a dielectric material 926 may be deposited over the entire surface of conductive material with an atomic layer deposition method. Conductive material 924 may include at least one material selected from the group consisting of: polysilicon, copper, aluminum, cobalt, nickel, and titanium. Dielectric material 926 may include at least one material selected from the group consisting of: silicon dioxide, nitride, zirconium oxide, aluminum oxide, and hafnium oxide.

Figure 9G:
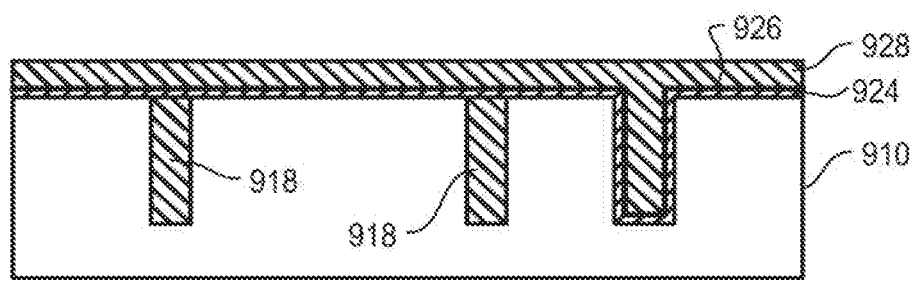

Referring now to FIG. 9G, a conductive material 928 may be deposited over the entire surface of substrate 910 including filling the remainder of deep trench 932. Conductive material 928 may include at least one material selected from the group consisting of: polysilicon, copper, aluminum, cobalt, nickel, and titanium.

Figure 9H:
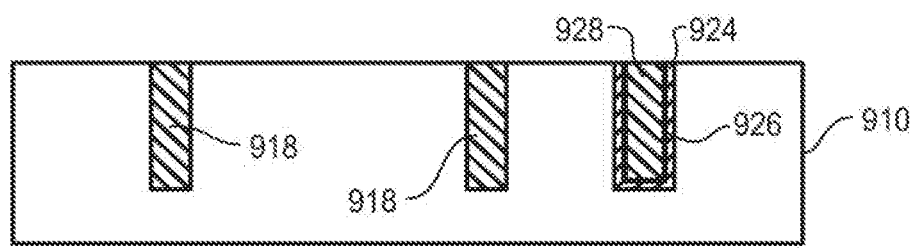

Referring now to FIG. 9H, in a next step, a chemical mechanical polishing process may be used to remove the conductive material 924, dielectric material 926, and conductive material 928 from the upper surface of substrate 910, leaving conductive material 924, dielectric material 926, and conductive material 928 in the deep trench 932.

Figure 9I:
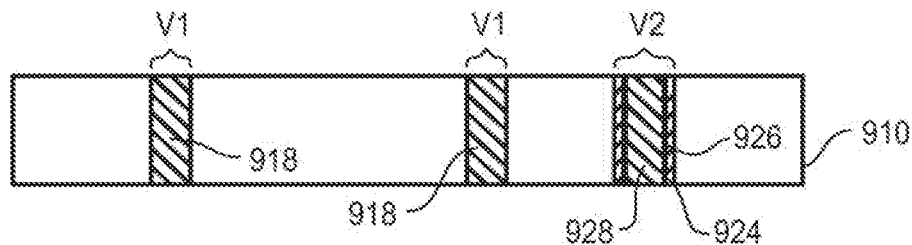

Referring now to FIG. 9I, in a next step, a substrate 910 may be thinned (a step of thinning) by grinding the back surface to remove the lower portions of substrate 910, conductive material 918, conductive material 924, dielectric material 926, and conductive material 928. In this way, through vias V1 and capacitance enhanced through vias V2 may be formed by exposing conductive material 928. Through vias V1 may include conductive material 918 to provide an electrical connection through a semiconductor device including substrate 910. Capacitance enhance through vias V2 may include conductive material 924 providing a first terminal for a capacitor, dielectric material 926 providing a dielectric layer for a capacitor, and conductive material 928 providing a second terminal for a capacitor and an electrical connection through a semiconductor device including substrate 910.

Figure 10:
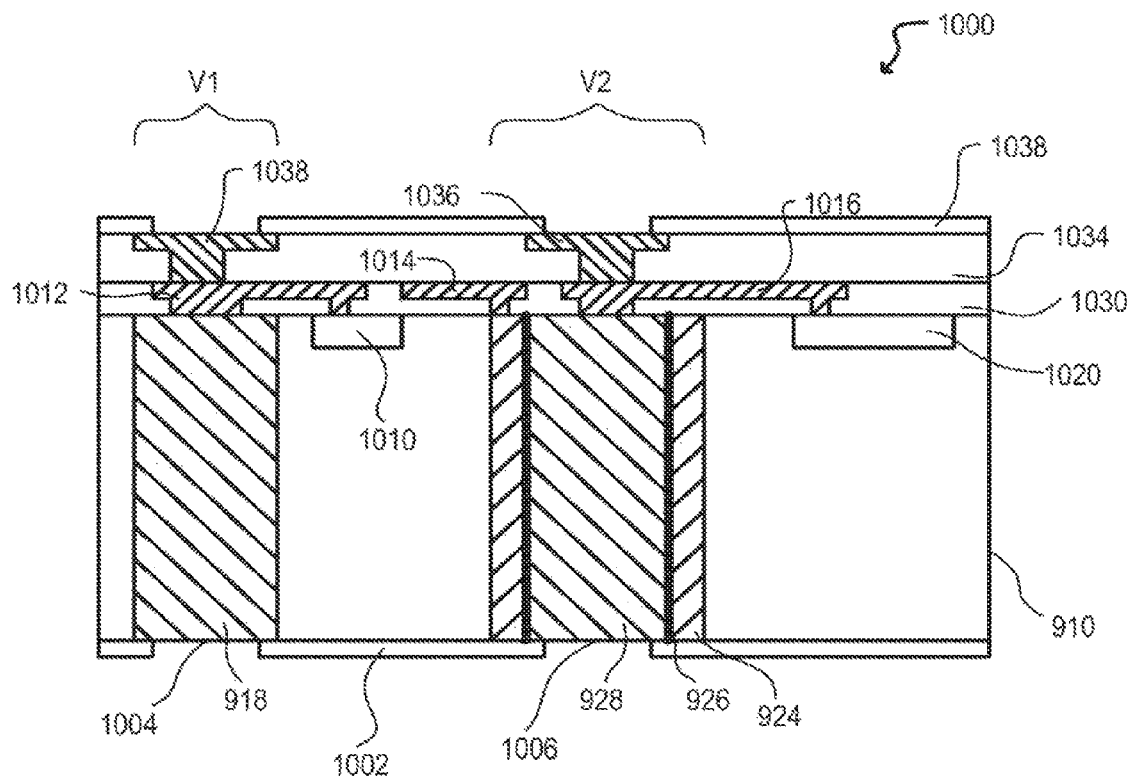
FIG. 10 is a cross-section diagram of a semiconductor device including through vias and capacitance enhanced through vias according to an embodiment.

Referring now to FIG. 10, a semiconductor device including through vias and capacitance enhance through vias according to an embodiment is set forth in a cross-sectional diagram. The semiconductor device in FIG. 10 illustrates subsequent interconnect wiring after through via V1 and capacitance enhance through via V2 structures have been formed.

In particular, the semiconductor device 1000 may further include a first circuit 1010 and a second circuit 1020. First circuit 1010 may correspond to any of internal power supply voltage generator circuits (118a to 118d), as just one example. Second circuit 1020 may correspond to any of reference voltage generator circuits (112a to 112d), boosted power supply voltage generator circuits (114a to 114d), bit line reference voltage generator circuits (116a to 116d), or internal power supply voltage generator circuits (118a to 118d), as just a few examples.

In a step, an insulating layer 1030 may be deposited and patterned. In a next step, a conductive material may be formed in the patterned areas of insulating layer 1030 to form interconnects (1012, 1014, and 1016).

In a next step, an insulating layer 1034 may be deposited and patterned. In a next step, a conductive material may be formed in the patterned areas of insulating layer 1034 to form a contact pad 1036 and a contact pad 1038.

In a step, an insulating layer 1038 may be patterned and etched to provide openings to contact pads (1036 and 1038).

In a step, an insulating layer 1002 may be patterned and etched to provide openings to contact pads (1004 and 1006), respectively, formed on a bottom surface of through via V1 and capacitance enhanced through via V2.

Contact pads (1036 and 1038) may be electrically connected to interface connections 122 (FIG. 1) on an upper surface of semiconductor device 1000 as needed and contact pads (1004 and 1006) may be electrically connected to interface connections 122 (FIG. 1) on bottom surface of semiconductor device 1000 as needed.

All of the steps illustrated in FIGS. 9A-9I and FIG. 10 may be performed simultaneously on a plurality of semiconductor devices on a contiguous wafer.

Subsequent to the process steps illustrated in FIGS. 9A-9I and FIG. 10, the wafer including semiconductor devices may be diced. Interface connections 122 may be placed on contact pads (1036 and 1038) or surface of semiconductor device 1000 as needed and contact pads (1004 and 1006). Interface connections 122 may be solder balls, solder bumps, or copper pillars, or the like. A plurality of semiconductors devices may then be stacked on an interposer 140, encapsulated, and external connections 150 may be placed to form a package of including a plurality of semiconductor devices (100, 300, 400, 500, 600, 700, and/or 800).

Figure 11:
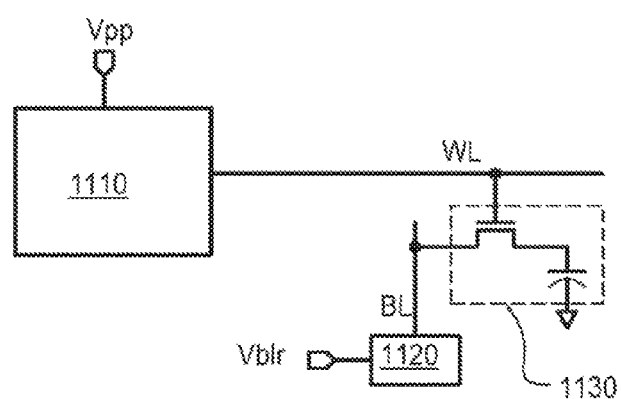
FIG. 11 is a circuit schematic diagram of a portion of a memory array circuit according to an embodiment.

Referring now to FIG. 11, a portion of memory array circuit according to an embodiment is set forth in a circuit schematic diagram.

The portion of a memory array circuit of FIG. 11 may include elements of memory array circuits (510a, 510b, 510c, and 510d) in FIG. 5 and/or elements of memory array circuits (610a, 610b, 610c, and 610d) in FIG. 6.

The portion of a memory array circuit of FIG. 11 may include a word line driver circuit 1110, a bit line precharge circuit 1120, and a memory cell 1130. Memory cell 1130 may be a dynamic random access memory (DRAM) cell including a transistor (an insulated gate field effect transistor (IGFET)) and a capacitor.

Word line driver circuit 1110 may receive boosted power supply voltage Vpp and may have an output connected to a word line WL. Bit line precharge circuit 1120 may receive a bit line reference voltage Vblr and may have an output connected to a bit line BL. Memory cell 1130 may be connected to word line WL and bit line BL at a cross point.

Figure 12:
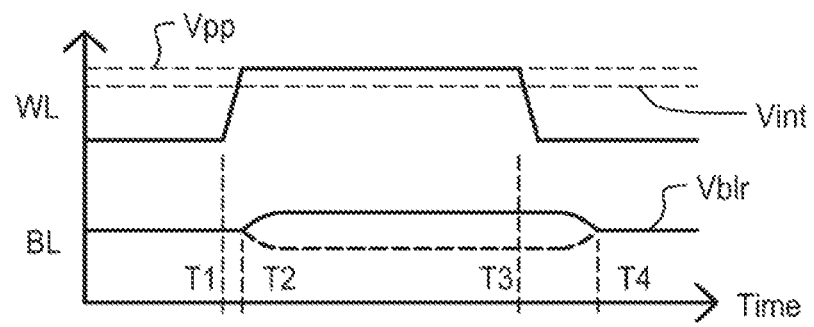
FIG. 12 is a waveform diagram illustrating the operation of the memory array circuits according to an embodiment.

Referring now to FIG. 12, a waveform diagram illustrating the operation of the memory array circuits of FIG. 11 according to an embodiment is set forth.

The waveform diagram of FIG. 12 includes waveforms for word line WL and bit line BL.

Initially, bit line BL may be precharged to the potential of the bit line reference voltage Vblr by bit line precharge circuit 1120. After a memory access, word line driver circuit 1110 may drive word line WL from a logic low to a logic high at time T1. At this time, word line WL may driven to a boosted power supply voltage Vpp. A transistor in memory cell MC may be turned on to transfer charge from a capacitor in memory cell MC to bit line BL. At time T2, a sense amplifier (not shown) may drive the bit line to a logic high (solid line) or logic low (dashed line) in response to the charge that was transferred from the memory cell MC to bit line BL.

At a time T3, word line driver circuit 1110 may drive word line WL back to a logic low level. At a time T4, bit line precharge circuit 1120 may precharge bit line BL back to a bit line reference voltage Vblr.

Figure 13:
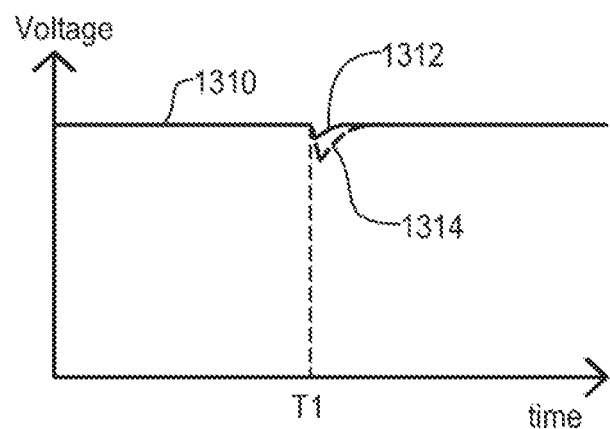
FIG. 13 is a waveform diagram illustrating a signal with a substantially stable voltage according to an embodiment.

Referring now to FIG. 13, a waveform diagram illustrating a signal with a substantially stable voltage is set forth.

The waveform diagram of FIG. 13 includes a signal 1310 that is intended to be a substantially stable voltage. Signal 1310 may be internal power supply voltage Vint, boosted power supply voltage Vpp, bit line reference voltage Vblr, reference voltage Vref, or the like. At time T1, a load attached to signal 1310 can draw an instantaneous current causing noise in the way of a dip. Dip 1312 can represent a case in which semiconductor devices (110a, 110b, 110c, and 110d) include capacitance enhance vias V2 and provide the voltage generators (112a-112d, 114a-114d, 116a-116d, and 118a-118d), respectively. Dip 1314 may represent a case in which a semiconductor device may generate the signal 1310 without the parallel driving of voltage generators commonly to a plurality of semiconductor devices or the use of capacitance enhanced vias V2. In particular, if a reference voltage Vref is used as a reference potential in an input buffer, incoming signals, such as data signal DATA or control signals CTL may be erroneously read when noise causes substantial variations in voltage level. Likewise, if substantial variations in voltage level occur in a bit line reference voltage Vblr, data in a dynamic random access memory (DRAM) cell may be erroneously read. If substantial variations in a voltage level occur in a boosted power supply voltage Vpp, proper levels may not be written into a DRAM cell and pause times may be compromised. If substantial variations in a voltage level occur in an internal power supply voltage Vint, internal circuits may not operate properly. Furthermore, internal power supply voltage Vint may be used to generate other voltages, such as boosted power supply voltage Vpp, bit line reference voltage Vblr, and reference voltage Vref, which can compound erroneous operations of a semiconductor device.

According to the embodiments, through vias V1 may provide an electrical connection for signals that may transition between logic states, such as control signals CTL and data signals DATA. Capacitance enhanced through vias V2 may provide an electrical connection from a first side to a second side of the respective semiconductor device for transmission of signals that remain substantially stable such as reference voltages (Vref and Vblr), power supply voltages (Vint and Vpp) or the like. Such reference voltages may remain substantially stable when a respective semiconductor device is in a normal (first) mode of operation, such as an active mode, for example, a read or write mode of operation in a semiconductor memory device. In this way, noise may be reduced and a reservoir of charge for circuits that provide a load for reference voltages and/or power supply voltages may be provided.

By distributing power supply generator circuits (114a to 114d and 118a to 118d) and reference voltage generator circuits (112a to 112d and 116a to 116d) throughout a package of a plurality of semiconductor devices (110a to 110d), adverse temperature effects may be reduced by distributing hot spots.

A voltage may be expressed as a potential. Internal power supply voltage Vint may be considered an internal power supply potential. Boosted power supply voltage Vpp may be considered a boosted power supply potential. Bit line reference voltage Vblr may be considered a bit line reference potential. Reference voltage Vref may be considered a reference potential.

Other electrical apparatus other than semiconductor devices may benefit from the invention.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A package, comprising:
a first semiconductor device, a second semiconductor device, and a third semiconductor device stacked in a first direction;
the first semiconductor device including
a first through via providing a first electrical connection in the first direction between a first side and a second side opposite the first side of the first semiconductor device; and
a first circuit, the first circuit provides a first reference potential at a first circuit output, the first circuit output is electrically connected to the first through via at the first side when the first semiconductor device is in a normal mode of operation; and
the second semiconductor device including
a second through via providing a second electrical connection in the first direction between a first side and a second side opposite the first side of the second semiconductor device wherein
the second semiconductor device includes a second circuit having a second circuit output electrically connected to the first through via at the second side of the first semiconductor device and the third semiconductor device is electrically connected to the second through via at the second side of the second semiconductor device to receive the first reference potential, the first circuit and the second circuit provide the first reference potential.

2. The package of claim 1, wherein:
the third semiconductor device includes a third circuit having a third circuit output electrically connected to the second through via at the second side of the second semiconductor device, the first circuit, the second circuit, and the third circuit provide the first reference potential.

3. The package of claim 1, wherein:
the first reference potential is a bit line reference potential.

4. The package of claim 3, wherein:
the first semiconductor device is a semiconductor memory device, the second semiconductor device is a semiconductor memory device and the third semiconductor device is a semiconductor memory device;
the first semiconductor memory device includes a first bit line precharge circuit coupled to receive the bit line reference potential;
the second semiconductor memory device includes a second bit line precharge circuit coupled to receive the bit line reference potential; and
the third semiconductor memory device includes a third bit line precharge circuit coupled to receive the bit line reference potential.

5. The package of claim 1, wherein:
the first semiconductor device includes an internal power supply generator circuit coupled to receive an external power supply potential and provide an internal power supply potential and the first circuit is coupled to receive the internal power supply potential.

6. The package of claim 1, wherein:
the first semiconductor device includes a first input buffer coupled to receive the first reference potential.

7. The package of claim 6, wherein:
the second semiconductor device includes a second input buffer coupled to receive the first reference potential and the third semiconductor device includes a third input buffer coupled to receive the first reference potential.

8. The package of claim 6, wherein:
the first semiconductor device includes an internal power supply generator circuit coupled to receive an external power supply potential and provide an internal power supply potential and the first circuit is coupled to receive the internal power supply potential.

9. The package of claim 1, wherein:
the reference potential is an internal power supply potential; and the first semiconductor device includes internal circuits that are coupled to receive and are powered by the internal power supply potential.

10. The package of claim 9, further including:

an external connection coupled to receive an external power supply potential, the external power supply potential is generated externally to the package wherein the first circuit is coupled to receive the external power supply potential.

11. The package of claim 1, wherein:

the first reference potential is a boosted power supply potential.

12. The package of claim 11, wherein:

the first semiconductor device is a semiconductor memory device, the second semiconductor device is a semiconductor memory device, and the third semiconductor device is a semiconductor memory device;

the first semiconductor memory device includes a first word line driver circuit coupled to receive the boosted power supply potential;

the second semiconductor memory device includes a second word line driver circuit coupled to receive the boosted power supply potential; and the third semiconductor memory device includes a third word line driver circuit coupled to receive the boosted power supply potential.

13. The package of claim 12, wherein:

the first semiconductor device is a dynamic random access memory (DRAM) device, the second semiconductor device is a DRAM device, and the third semiconductor device is a DRAM device.

14. The package of claim 1, wherein:

the first semiconductor device includes a third through via providing a third electrical connection in the first direction between the first side and the second side opposite the first side of the first semiconductor device; and the first through via has a first capacitance value and the third through via has a second capacitance value that is less than the first capacitance value.

15. The package of claim 14, wherein:

the first capacitance value is substantially greater than the second capacitance value.

16. The package of claim 15, wherein:

the first capacitance value is at least 10 times greater than the second capacitance value.

17. The package of claim 1, wherein:

the first through via including a first conductive material providing the electrical connection between the first side and the second side of the semiconductor device;

a second conductive material surrounding at least a portion of the first conductive material and separated from the first conductive material by a first dielectric layer.

18. The package of claim 17, further including:

the second conductive material is electrically connected to a second reference potential.

19. The package of claim 18, wherein:

the second reference potential is a ground potential.

20. The package of claim 1, wherein:

the first reference potential remains substantially stable while the first semiconductor device is in the normal mode of operation, the normal mode of operation is an active mode of operation.

\* \* \* \* \*